United States Patent
Lin et al.

(10) Patent No.: US 8,531,009 B2
(45) Date of Patent: Sep. 10, 2013

(54) PACKAGE STRUCTURE OF THREE-DIMENSIONAL STACKING DICE AND METHOD FOR MANUFACTURING THE SAME

(75) Inventors: Chun-Te Lin, Taipei County (TW); Tzu-Ying Kuo, Taipei (TW); Shu-Ming Chang, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 14 days.

(21) Appl. No.: 12/205,443

(22) Filed: Sep. 5, 2008

(65) Prior Publication Data

US 2009/0283872 A1    Nov. 19, 2009

(30) Foreign Application Priority Data

May 13, 2008  (TW) ................................ 97117518 A

(51) Int. Cl.
*H01L 23/48* (2006.01)
*H01L 21/58* (2006.01)

(52) U.S. Cl.
USPC ........... 257/621; 257/686; 257/773; 257/774; 257/777; 257/E23.01; 257/E23.011

(58) Field of Classification Search
USPC .................... 257/621, E23.01, E23.011, 686, 257/773, 774, 777
See application file for complete search history.

(56) References Cited

U.S. PATENT DOCUMENTS

| | | | |
|---|---|---|---|
| 5,380,681 A | 1/1995 | Hsu | |
| 5,424,245 A * | 6/1995 | Gurtler et al. | 438/107 |
| 5,646,067 A | 7/1997 | Gaul | |
| 5,667,132 A * | 9/1997 | Chirovsky et al. | 228/180.22 |
| 5,986,339 A * | 11/1999 | Pai et al. | 257/700 |
| 6,002,177 A | 12/1999 | Gaynes et al. | |
| 6,410,415 B1 * | 6/2002 | Estes et al. | 438/612 |
| 6,443,351 B1 * | 9/2002 | Huang et al. | 228/103 |
| 6,448,661 B1 | 9/2002 | Kim et al. | |
| 6,608,371 B2 | 8/2003 | Kurashima et al. | |
| 6,703,689 B2 * | 3/2004 | Wada | 257/621 |
| 6,841,883 B1 * | 1/2005 | Farnworth et al. | 257/777 |
| 6,848,177 B2 | 2/2005 | Swan et al. | |
| 6,852,621 B2 * | 2/2005 | Hanaoka et al. | 438/638 |
| 6,903,442 B2 | 6/2005 | Wood et al. | |
| 6,998,344 B2 | 2/2006 | Akram et al. | |
| 2002/0019069 A1 | 2/2002 | Wada | |
| 2002/0030245 A1 * | 3/2002 | Hanaoka et al. | 257/621 |
| 2002/0031868 A1 * | 3/2002 | Capote et al. | 438/126 |
| 2002/0190375 A1 * | 12/2002 | Mashino et al. | 257/734 |
| 2004/0238927 A1 * | 12/2004 | Miyazawa | 257/678 |
| 2004/0251554 A1 * | 12/2004 | Masuda | 257/773 |
| 2004/0256734 A1 * | 12/2004 | Farnworth et al. | 257/777 |
| 2005/0067713 A1 * | 3/2005 | Mutta et al. | 257/774 |

(Continued)

*Primary Examiner* — Peniel M Gumedzoe
(74) *Attorney, Agent, or Firm* — Birch, Stewart, Kolasch & Birch, LLP

(57) ABSTRACT

This invention provides a package structure of three-dimensional stacking dice and its manufacturing method. This invention employs the Through-Silicon-Vias (TSVs) technology to establish vertical electrical connection of the three-dimensional stacking dice and a redistribution layer between a blind hole-on-pad and a vertical through hole formed by the TSVs technology to direct the electrical connection from a first surface to an opposite second surface of this structure. In addition, this invention employs a conductive bump completely covering the pads jointed together between the stacking dice to avoid breakage of the pads. The reliability of the three-dimensional stacking dice of the present invention is increased.

6 Claims, 9 Drawing Sheets

(56) References Cited

U.S. PATENT DOCUMENTS

| | | | |
|---|---|---|---|
| 2006/0286789 A1* | 12/2006 | Sunohara et al. | 438/598 |
| 2007/0045836 A1 | 3/2007 | Kwon et al. | |
| 2007/0281374 A1 | 12/2007 | Lee et al. | |
| 2008/0105952 A1* | 5/2008 | Ichikawa | 257/621 |
| 2008/0115961 A1* | 5/2008 | Mok et al. | 174/250 |

* cited by examiner

PACKAGE STRUCTURE OF THREE-DIMENSIONAL STACKING DICE AND METHOD FOR MANUFACTURING THE SAME

BACKGROUND OF THE INVENTION

1. Field of the Invention

The present invention relates to a package structure of three-dimensional stacking dice and its manufacturing method. More particularly, the present invention relates to a wafer-level manufacturing method for fabricating the package structure of three-dimensional stacking dice.

2. Description of the Related Art

The three-dimensional integrated circuit package structure is generated due to the demand of electronic devices having lightweight and being thin, short and small. The Through-Silicon-Vias (TSVs) technology is employed to form vertical through holes in a silicon wafer, and filling insulating material and metallic material in the vertical through holes to form vertical electrical connection structures in the silicon wafer. Then, the silicon wafers are stacked together to form the three-dimensional integrated circuit package structure. This package structure has short electrical connection paths to avoid electricity problems happened in the electronic devices due to the increasingly shrinkage of the linewidth. This package structure also can increase the electrical transmission speed and is suitable for high-speed computation devices or memory devices. Moreover, this package structure is a kind of vertical stacking dice structure and can meet the demands of the electronic devices having lightweight, being thin, short and small as well as high-density package. The three-dimensional integrated circuit stacking structure has become a primary advanced package structure in the future.

SUMMARY OF THE INVENTION

The present invention provides a package structure of three-dimensional stacking dice and its manufacturing method, which employs the through-silicon-vias (TSVs) technology to establish vertical electrical connection of the three-dimensional stacking dice to shorten electrical transmission paths, and furthermore improving the electrical transmission speed.

An exemplary example of the present invention provides a package structure of three-dimensional stacking dice and its manufacturing method, which employs a redistribution layer between a blind hole-on-pad and a vertical through hole to direct the electrical connection of the three-dimensional stacking dice from a first surface to an opposite second surface of this structure.

An exemplary example of the present invention provides a package structure of three-dimensional stacking dice and its manufacturing method, which employs conductive bumps to cover jointed conductive pads between said stacking dice to prevent the conductive pads from breakage, and hence improving reliability of the three-dimensional stacking dice.

An exemplary example of the present invention provides a package structure of three-dimensional stacking dice and its manufacturing method, which employs a conductive pattern layer on a die as a hard-mask layer for manufacturing a conductive wire structure on the die.

Besides, in one embodiment consistent of the invention provides a die structure having vertical electrical conductance, which employs a redistribution layer between a blind hole-on-pad and a vertical through hole to direct the electrical connection of the die from a first surface to an opposite second surface thereof.

In one embodiment consistent of the invention provides a three-dimensional stacking dice package structure at least comprising a first substrate, a second substrate and at least one first conductive bump. The first substrate includes: at least one die, at least one first conductive pad, at least one through hole and at least one blind hole, in which the first conductive pad is formed on a first surface of the first substrate, the through hole passes through the first conductive pad and the first substrate, and the blind hole is formed on the first conductive pad; an insulating layer formed on surroundings of the through hole and blind hole and the first surface of the first substrate as well as a second surface of the first substrate opposite to the first surface; an electrical connection layer formed on the insulating layer and filling the through hole and blind hole so as to direct electrical connection of the first substrate from the first surface to the second surface thereof; a second substrate having a structure the same with that of the first substrate, the second substrate stacking under the first substrate such that the electrical connection layer on a first surface of the second substrate joints to the electrical connection layer on the second surface of the first substrate; and at least one first conductive bump covering the electrical connection layers jointing to each other.

In one embodiment consistent of the invention provides a method for manufacturing a three-dimensional stacking dice package structure, comprising: providing a substrate having at least one die and at least one first conductive pad formed on a first surface thereof; forming at least one first through hole passing through the first conductive pad and the substrate; forming an insulating layer covering the first surface of the substrate and a second surface of the substrate opposite to the first surface as well as filling the first through hole; forming at least one second through hole passing through the insulating layer inside the first through hole and at least one blind hole passing the insulating layer over one of the first conductive pads corresponding thereto; forming a conductive layer to fill the second through hole and the blind hole as well as cover the first surface and the second surface of the substrate to direct electrical connection of the substrate from the first surface to the second surface thereof; forming a conductive hard-mask layer respectively on the conductive layer on the first surface and the second surface of the substrate; etching the conductive hard-mask layers to respectively form a conductive wire pattern mask on the first surface and the second surface of the substrate; and making at least two aforesaid substrates stack and joint together in a way of backside-to-front side so that the conductive wire pattern layers corresponding to each other are jointed together and the conductive hard-mask layers cover them.

In one embodiment consistent of the invention provides a die structure with vertical electrical conductance comprising a die, an insulating layer, an electrical connection layer and at least one conductive hard-mask pattern layer. The die has at least one conductive pad, at least one through hole and at least one blind hole, in which the conductive pad is formed on a first surface of the die, the through hole passes through the conductive pad and the die, and the blind hole is formed over the conductive pad. The insulating layer is formed on surroundings of the through hole and blind hole and the first surface of the die as well as a second surface of the die opposite to the first surface. The electrical connection layer is formed on the insulating layer and fills the through hole and blind hole so as to direct electrical connection of the die from the first surface to the second surface thereof. The conductive hard-mask pattern layers are respectively formed on the electrical connection layer on the first surface and the second surface of the die.

DETAILED DESCRIPTION OF THE PREFERRED EMBODIMENTS

Figure 1A:
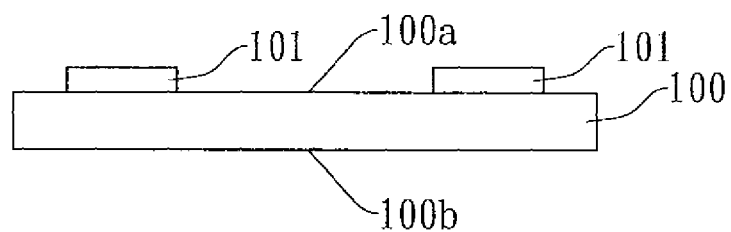
FIG. 1A to FIG. 1K show schematic cross-sectional structures corresponding to various steps of a method for fabricating the package structure of the three-dimensional stacking dice according to a first exemplary embodiment consistent of the present invention.
Figure 1B:
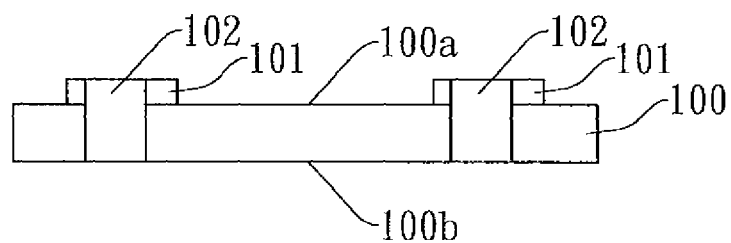
Figure 1C:
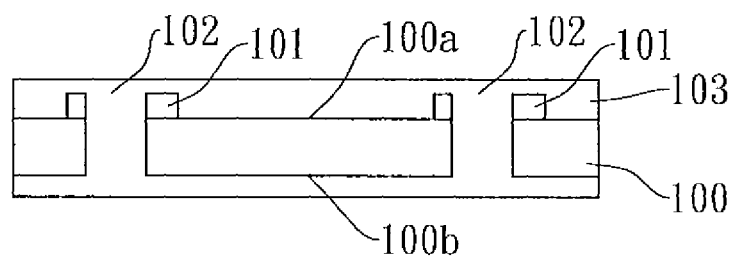
Figure 1D:
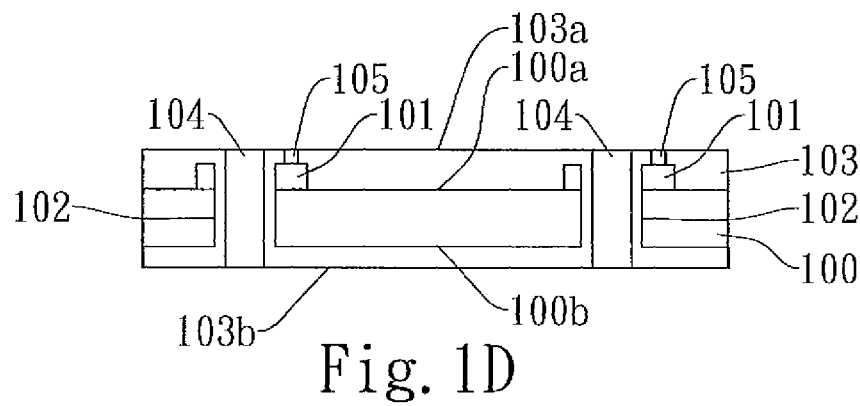

An exemplary embodiment consistent of the present invention provides a package structure of three-dimensional stacking dice and its manufacturing method, especially providing a package structure of three-dimensional stacking dice made by a wafer-level manufacturing process. The present invention will be described in detail, in accordance with following embodiments with reference to accompanying drawings.

FIG. 1A to FIG. 1K show schematic cross-sectional structures corresponding to various steps of a method for fabricating the package structure of the three-dimensional stacking dice according to a first exemplary embodiment consistent of the present invention. Please refer to FIG. 1A, a substrate 100 is provided. The substrate 100 has at least a die (not shown) and at least a first conductive pad 101 formed on a first surface 100a thereof. The substrate 100 can be a silicon wafer having a plurality of integrated circuit devices and a plurality of metallic pads, for example Ni/Au alloy pad formed on a surface of the silicon wafer. The substrate 100 can be a III-V group wafer or a glass wafer. Please refer to FIG. 1B, the Through-Silicon-Vias (TSVs) technology is performed to form at least a first through hole 102 passing through the first conductive pad 101 and the substrate 100. For example, the first through hole 102 can be formed by laser drilling, dry etching or wet etching. Please refer to FIG. 1C, an insulating layer 103 is formed to cover the first surface 100a of the substrate 100 and a second surface 100b opposite to the first surface 100a as well as fills the first through hole 102. The insulating layer 103 can be a polymeric insulating layer, for example ABF(Ajinomoto Build-up Film) insulating layer to form on the first surface 100a and the second surface 100b of the substrate 100 and fill the first through hole 102 by double-sided lamination. Please refer to FIG. 1D, at least a second through hole 104 is formed to pass through the insulating layer 103 inside the first through hole 102 corresponding thereto and at least a blind hole (Via-on-Pad) 105 over the first conductive pad 101 corresponding thereto. In the first exemplary embodiment consistent of the present invention can employ the laser drilling to form the second through hole 104 and the blind hole 105.

Figure 1E:
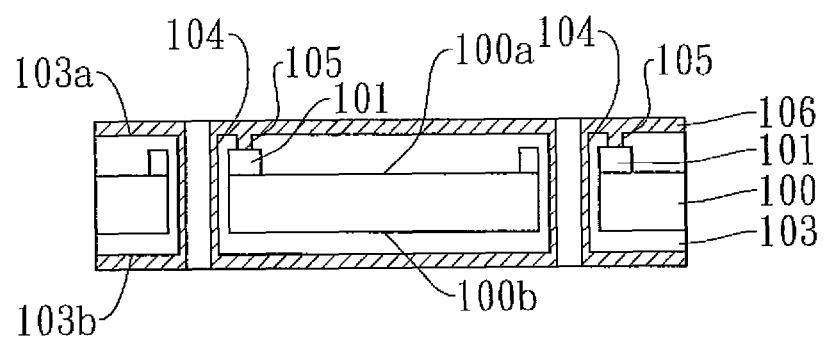

Please refer to FIG. 1E, a first conductive layer 106 is formed on the surrounding of the second through hole 104 and filled in the blind hole 105 as well as covers an upper surface 103a of the insulating layer 103 over the substrate 100 and a lower surface 103b of the insulating layer 103 under the substrate 100. In the first embodiment, the first conductive layer 106 fills the blind hole 105 since the blind hole 105 has a smaller inner diameter. The first conductive layer 106 is served as a seed layer to subsequently facilitate the fabrication of an electroplating metal layer. The first conductive layer 106 can be a TiW layer deposited by sputtering.

Figure 1F:
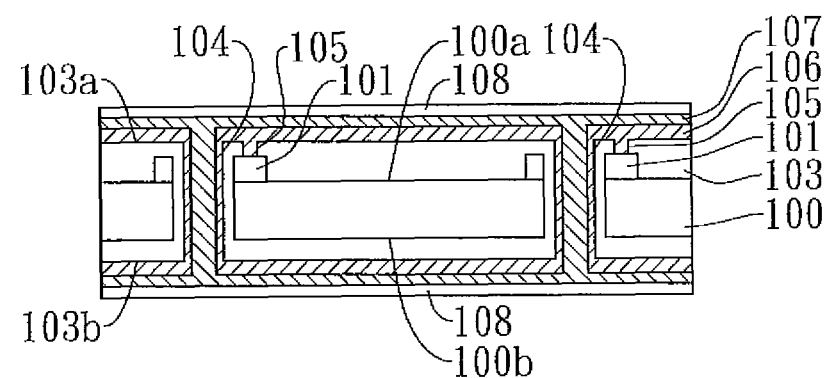

Pease refer to FIG. 1F, continually, a second conductive layer 107 is formed by electroplating or electroless plating. For example, a copper layer is formed on the first conductive layer 106 and filled in the second through hole 104. As a consequence, the electrical connection of the substrate 100 is directed from the first surface 100a to the second surface 100b. In the first embodiment, in case that the blind hole 105 is not filled by the first conductive layer 106, it still can be filled by the second conductive layer 107 subsequently formed (not shown). Please refer to FIG. 1D again, in the first embodiment, the present invention also can form an electrical connection layer to fill the second through hole 104 and the blind hole 105 as well as cover the upper surface 103a of the insulating layer 103 over the substrate 100 and the lower surface 103b of the insulating layer 103 under the substrate 100.

Please refer to FIG. 1F, a third conductive layer 108 with a predetermined thickness is respectively formed on the second conductive layer 107 over a first surface 100a and a second surface 100b of the substrate 100. The third conductive layer 108 can be a tin(Sn) or solder layer deposited by electroplating. The electroplating thickness of the third conductive layer 108 can be pre-calculated so as to make sure the minimum thickness of the third conductive layer 108 can completely cover the jointed pads between the stacking dice after completing a reflow step subsequent to the step for stacking and jointing the dice. As a result, the breakage of the pads can be avoided.

Figure 1G:
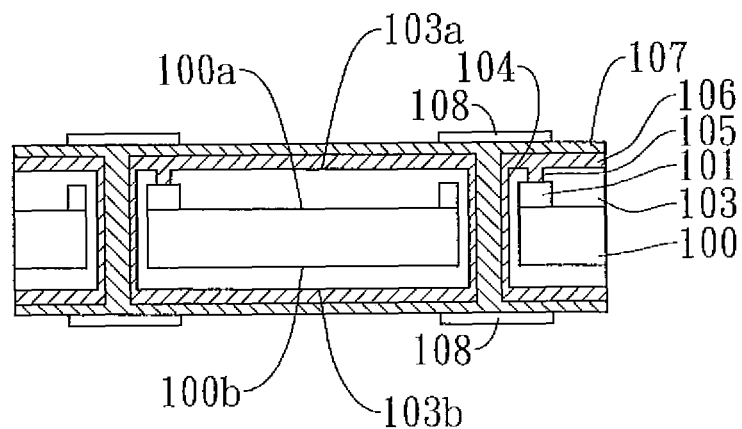

Please refer to FIG. 1G, the third conductive layer 108 can be served as a conductive hard-mask layer for respectively fabricating a conductive pattern (redistribution layer) over the first surface 100a and the second surface 100b of the substrate 100 in the following step. The third conductive layer 108 is etched and patterned by laser etching to respectively form a conductive wire pattern mask on the second conductive layer 107 over the first surface 100a and the second surface 100b of the substrate 100 to facilitate the fabrication of the conductive wire pattern respectively over the first surface 100a and the second surface 100b of the substrate 100.

Figure 1H:
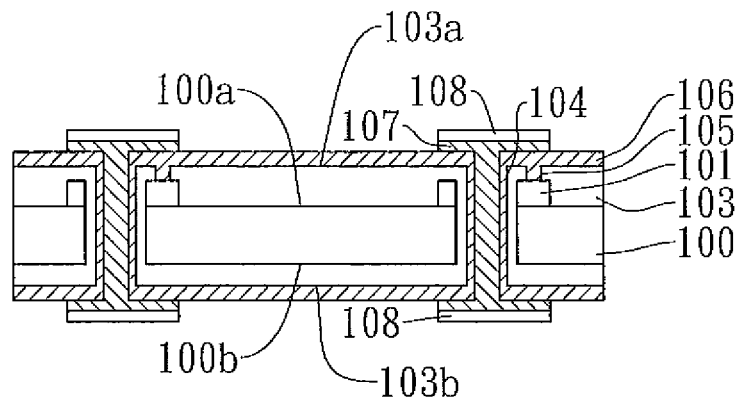
Figure 1I:
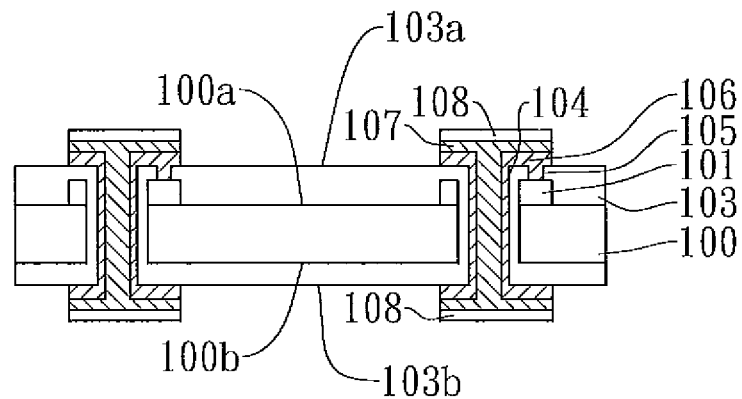

Please refer to FIG. 1H, the second conductive layer 107 is etched by chemical etching or physical etching, for example dry etching or wet etching. Please refer to FIG. 1I, continually, the first conductive layer 106 is etched by chemical etching or physical etching, for example dry etching or wet etching to form the conductive wire pattern respectively over the first surface 100a and the second surface 100b of the substrate 100. The conductive wire pattern includes the first conductive layer 106, the second conductive layer 107 and the third conductive layer 108.

In the first embodiment, the present invention employs the conductive wire pattern between the second through hole 104 and the blind hole 105 over the first conductive pad 101 to serve as a redistribution layer to direct the electrical connection of the substrate 100 from the first surface 100a to the second surface 100b. Moreover, the fabrication of the conductive wire pattern employs the third conductive layer 108 as a hard-mask layer and hence the photolithograph process is not required. The manufacturing cost of the present invention can be reduced.

Besides, in the first embodiment, as described in the above, an electrical connection layer can be directly deposited and filled in the second through hole 104 and the blind hole 105 as well as covering the upper surface 103a of the insulating layer 103 over the substrate 100 and the lower surface 103b of the insulating layer 103 under the substrate 100. Continually, a patterned conductive hard-mask layer with a predetermined thickness is respectively formed on the electrical connection layer over the upper surface 103a and under the lower surface 103b of the insulating layer 103. In this situation, the electrical connection layer can be etched one time to form the conductive wire pattern.

Figure 1J:
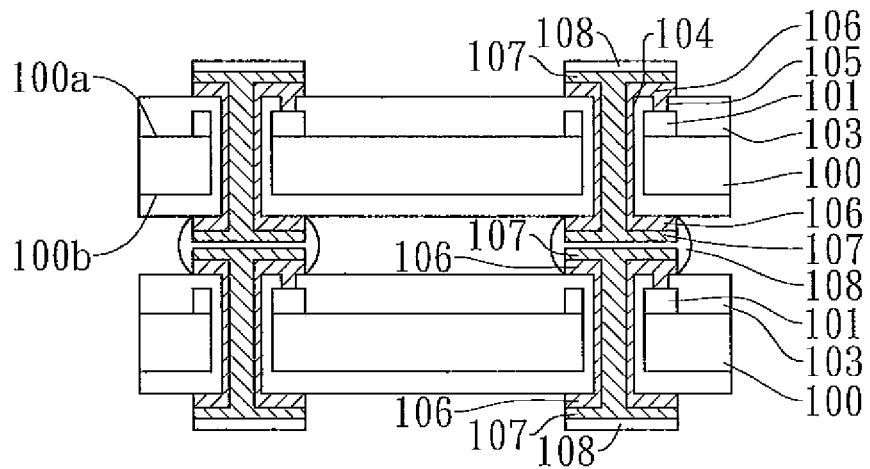
Figure 3:
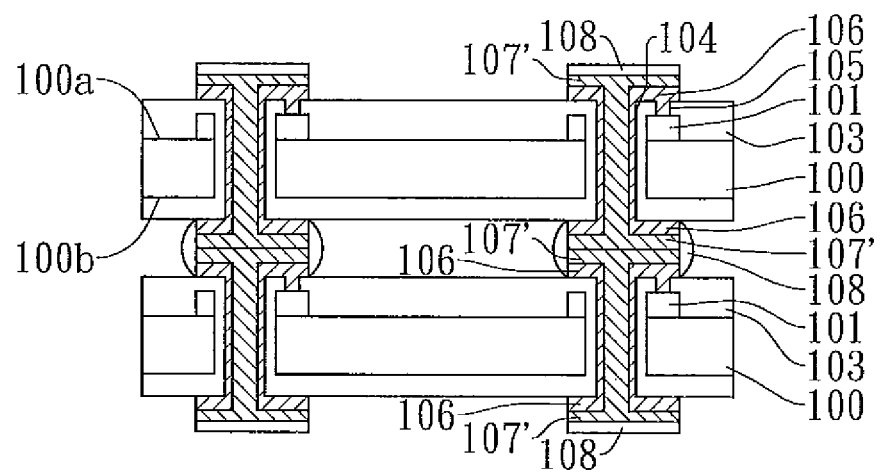
FIG. 3 is a variance of the stacking substrates of the first exemplary embodiment consistent of the present invention.

Please refer to FIG. 1J, a step for stacking dice is proceeded to make at least the two substrates 100 completing the above manufacturing steps stacking and jointing together in a way of backside-to-front side such that the conductive wire pattern layers corresponding thereto jointed to each other. Then, a reflow process is performed to make the third conductive layers 108 jointed to each other molten and completely cover the first conductive layer 106 and the second conductive layer 107. In this situation, the patterned first conductive layer 106 and second conductive layer 107 constitute an electrical connection layer on the insulating layer 103 over the first surface 100a and the second surface 100b of the substrate 100. In the first embodiment, after the reflow step, the third conductive layers 108 can completely cover the electrical connection layers jointed to each other of the upper and lower substrates 100, and the electrical connection layers are jointed together through the third conductive layers 108, as shown in FIG. 1J. Alternatively, the second conductive layers 107' of the electrical connection layers jointed together of the upper and lower substrates 100 can directly contact to each other, as shown in FIG. 3, and the third conductive layers 108 completely cover the electrical connection layers. A wafer-level manufacturing method for fabricating the present three-dimensional stacking dice is realized by way of the above steps.

Figure 1K:
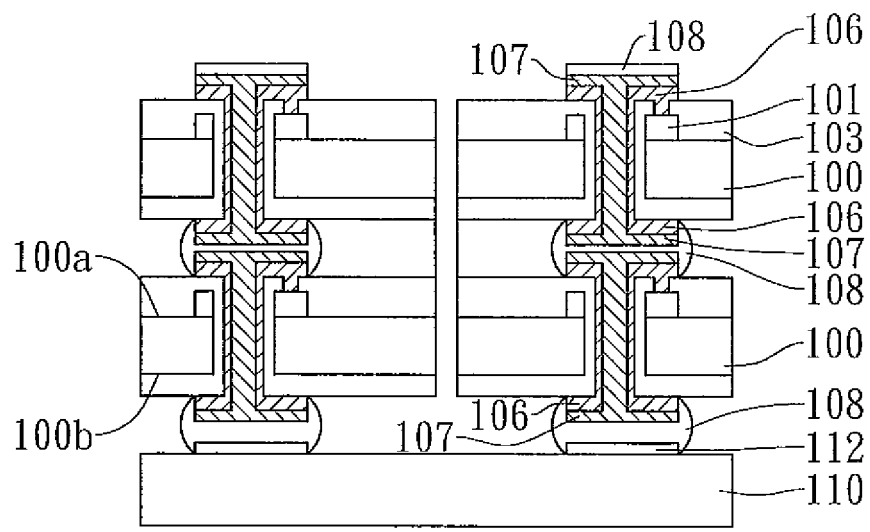

Please refer to FIG. 1K, a step for dicing the stacking dice is proceeded to separate individual stacking dice from the stacking substrates. Continually, the individual stacking dice is attached unto a circuit board 110 such that the conductive wire pattern under the second surface 100b of the bottom substrate 100 of the individual stacking dice is jointed to at least one second conductive pad 112 on the circuit board 110 corresponding thereto. A reflow step is performed to make the third conductive layer 108 molten and completely cover the electrical connection layer under the second surface 100b of the bottom substrate 100 and the second conductive pad 112 jointed to each other. This circuit board 110 can be a printed circuit board, or its material can be silicon or ceramic. As a result, the package structure of the three-dimensional stacking dice of the present invention is completed. It should be noted that the electrical connection layers jointed together between the stacking dice and the electrical connection layer and the second conductive pad 112 jointed to each other between the stacking dice and the circuit board 110 are completely covered by the reflowed third conductive layers 108. The breakage of the electrical connection layers and the second conductive pads 112 are avoided. The reliability of the package structure of the three-dimensional stacking dice is increased.

Figure 1L:
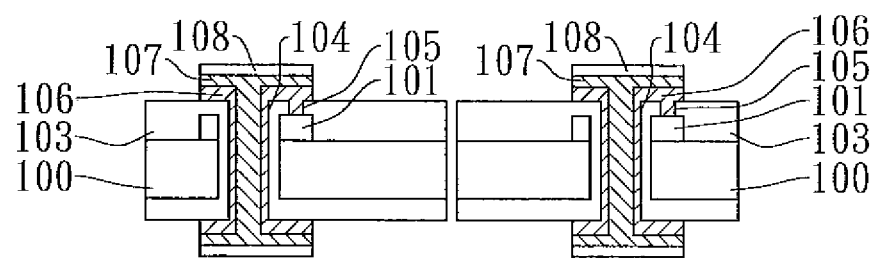
FIG. 1L shows individual die is diced and separated from a wafer completed by the method of the first exemplary embodiment consistent of the present invention.

Please refer to FIG. 1L, in the first embodiment, the die having the vertical electrical conductance made by the above wafer-level manufacturing process can be diced and separated from the substrate 100. Then, at least the two dices are stacked and jointed together in a way of backside-to-front side as the above. Then, the individual stacking dice is assembled unto the circuit board 110 as the above. The same package structure of the three-dimensional stacking dice is obtained.

FIG. 2A to FIG. 2K show schematic cross-sectional structures corresponding to various steps of a method for fabricating the package structure of the three-dimensional stacking dice according to a second embodiment consistent of the present invention. Please refer to FIG. 2A, a substrate 200 is provided. The substrate 200 has at least a die (not shown) and at least a first conductive pad 201 formed on a first surface 200a thereof, The substrate 200 can be a silicon wafer having a plurality of integrated circuit devices and a plurality of metal pads, for example Ni/Au alloy pad formed thereon. The substrate 200 can be a III-V group wafer or glass wafer. Please refer to FIG. 2B, the Through-Silicon-Vias (TSVs) technology is performed to form at least a first through hole 202 passing through the first conductive pad 201 and the substrate 200. For example, the first through hole 202 can be formed by laser drilling, dry etching or wet etching. Please refer to FIG. 2C, an insulating layer 203 is deposited on surrounding of the first through hole 202, and covering a first surface 200a of the substrate 200 and a second surface 200b opposite to the first surface 200a. The insulating layer 203 can be a silicon dioxide layer or a silicon nitride layer. In case that the substrate 200 is a silicon wafer, a silicon dioxide layer, by thermal oxidation, can be directly formed on the surrounding of the first through hole 202 and cover the first surface 200a and the second surface 200b of the substrate 200.

Figure 2A:
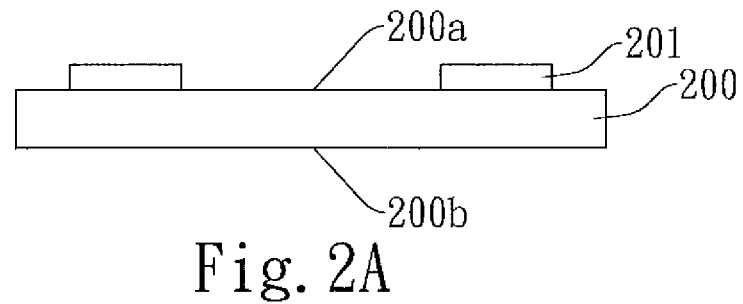
FIG. 2A to FIG. 2K show schematic cross-sectional structures corresponding to various steps of a method for fabricating the package structure of the three-dimensional stacking dice according to a second exemplary embodiment consistent of the present invention.
Figure 2B:
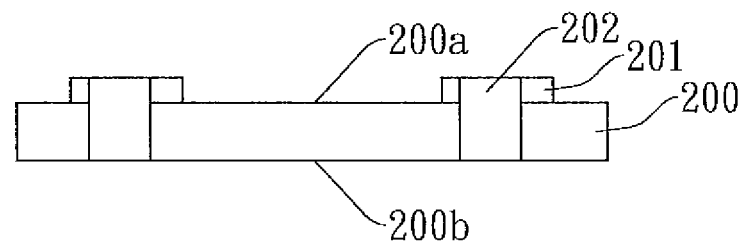
Figure 2C:
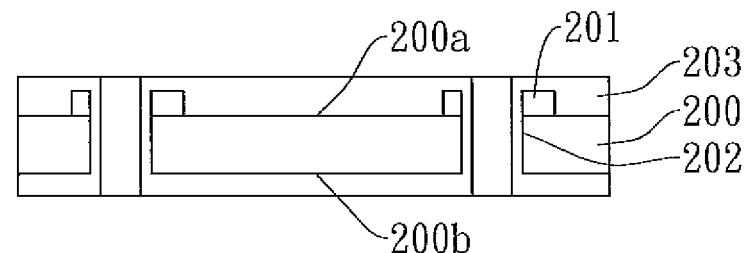
Figure 2D:
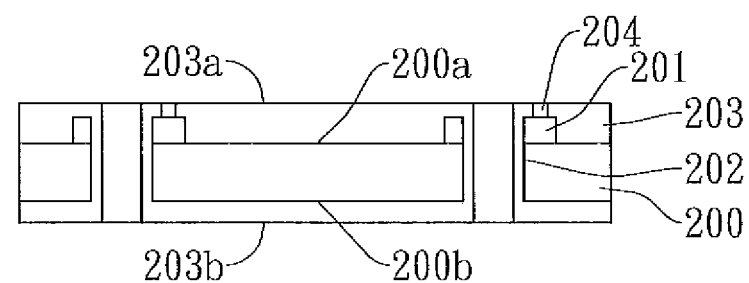
Figure 2E:
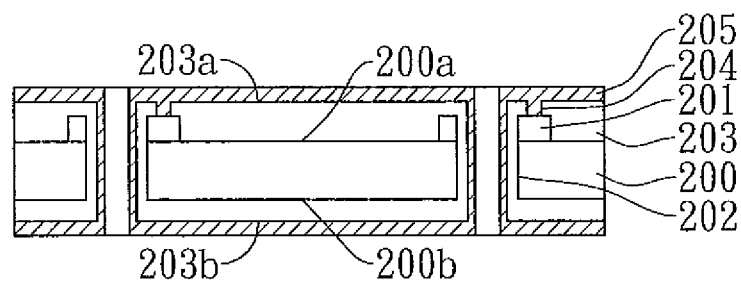

Please refer to FIG. 2D, at least a blind hole 204 is formed over one of the first conductive pads 201 corresponding thereto. Please refer to FIG. 2E, continually, a first conductive layer 205 is formed on the insulating layer 203 inside the surrounding of the first through hole 202 and an upper surface 203a of the insulating layer 203 over the substrate 200 and a lower surface 203b under the substrate 200 as well as in the blind hole 204. The first conductive layer 205 can fill the blind hole 204 since the blind hole 204 has a smaller inner diameter. The first conductive layer 205 is served as a seed layer to facilitate the fabrication of an electroplating metal layer subsequently. The first conductive layer 205 can be a TiW layer deposited by sputtering.

Figure 2F:
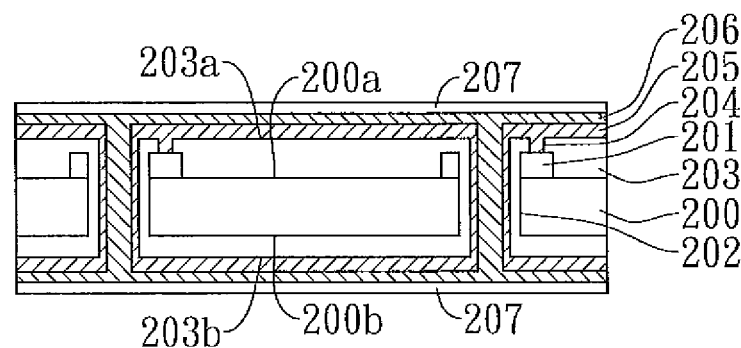

Please refer to FIG. 2F, continually, a second conductive layer 206, for example a copper layer is deposited on the first conductive layer 205, and filling the first through hole 202 as well as covering the first conductive layer 205 over the blind hole 204 and the upper surface 203a and lower surface 203b of the insulating layer 203. As a consequence, the electrical connection of the substrate 200 is directed from the first surface 200a to the second surface 200b. In the second embodiment, in case that the blind hole 204 is unfilled by the first conductive layer 205. The blind hole 204 still can be filled by the second conductive layer 206 in the following step (not shown).

Please refer to FIG. 2D again, in the second embodiment, the present invention also can form an electrical connection layer to fill the first through hole 202 and the blind hole 204 as well as cover the upper surface 203a of the insulating layer 203 over the substrate 200 and the lower surface 203b of the insulating layer 203 under the substrate 200. The electrical connection of the substrate 200 is thus directed from the first surface 200a to the second surface 200b. Please refer to FIG.

2F again, a third conductive layer 207 with a predetermined thickness is respectively formed on the second conductive layer 206 over the upper surface 203a and under the lower surface 203b of the insulating layer 203. The third conductive layer 207 can be a tin(Sn) or solder layer deposited by electroplating. The electroplating thickness of the third conductive layer 207 can be pre-calculated so as to make sure the minimum thickness of the third conductive layer 207 can completely cover the jointed pads between the stacking dice after completing a reflow step subsequent to the step for stacking and jointing the dice. As a result, the breakage of the pads can be avoided.

Figure 2G:
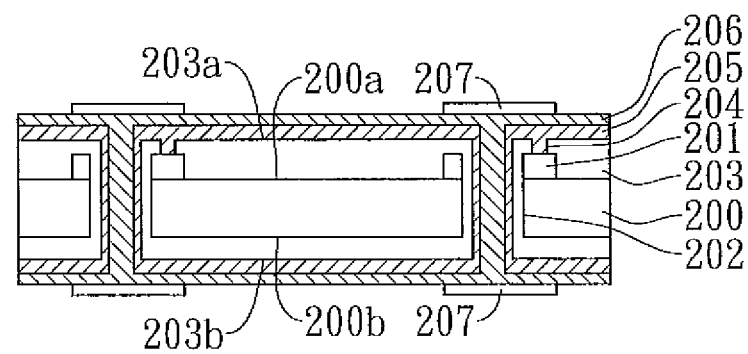
Figure 2H:
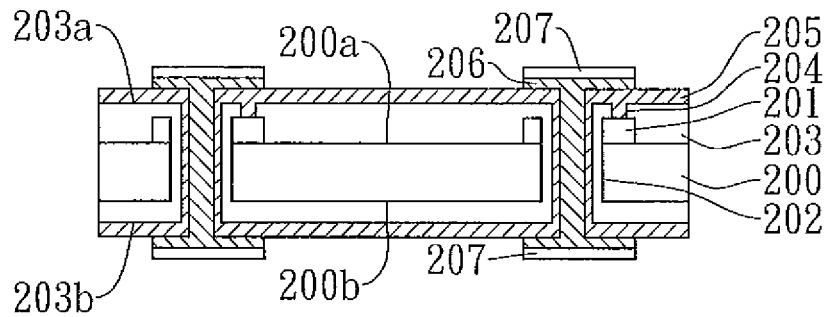
Figure 2I:
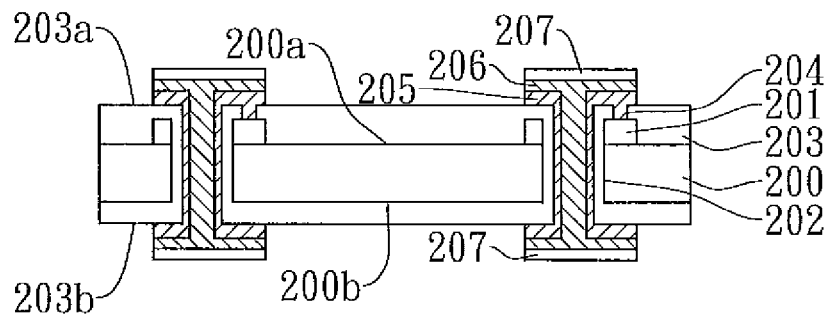

Please refer to FIG. 2G, the third conductive layer 207 can be served as a conductive hard-mask layer for respectively fabricating a conductive wire pattern (redistribution layer) over the upper surface 203a and under the lower surface 203b of the insulating layer 203 in the following step. The third conductive layer 207 is etched and patterned by laser etching to respectively form a conductive wire pattern mask on the second conductive layer 206 over the upper surface 203a and under the lower surface 203b of the insulating layer 203 to facilitate the fabrication of the conductive wire pattern respectively over the upper surface 203a and under the lower surface 203b of the insulating layer 203. Please refer to FIG. 2H, the second conductive layer 206 is etched by chemical etching or physical etching, for example dry etching or wet etching. Please refer to FIG. 2I, continually, the first conductive layer 205 is etched by chemical etching or physical etching, for example dry etching or wet etching to form the conductive wire pattern respectively over the upper surface 203a and under the lower surface 203b of the insulating layer 203. The conductive wire pattern includes the first conductive layer 205, the second conductive layer 206 and the third conductive layer 207. In the second embodiment, the present invention employs the conductive wire pattern between the first through hole 202 and the blind hole 204 over the first conductive pad 201 to serve as a redistribution layer to direct the electrical connection of the substrate 200 from the first surface 200a to the second surface 200b. Moreover, the fabrication of the conductive wire pattern employs the third conductive layer 207 as a hard-mask layer and hence the photolithograph process is not required. The manufacturing cost of the present invention can be reduced.

Besides, in the second embodiment, as described in the above, an electrical connection layer can be directly deposited and filled in the first through hole 202 and the blind hole 204 as well as covering the upper surface 203a and the lower surface 203b of the insulating layer 203. Continually, a patterned conductive hard-mask layer is respectively formed on the electrical connection layer over the upper surface 203a and under the lower surface 203b of the insulating layer 203. In this situation, the electrical connection layer can be etched one time to form the conductive wire pattern.

Figure 2J:
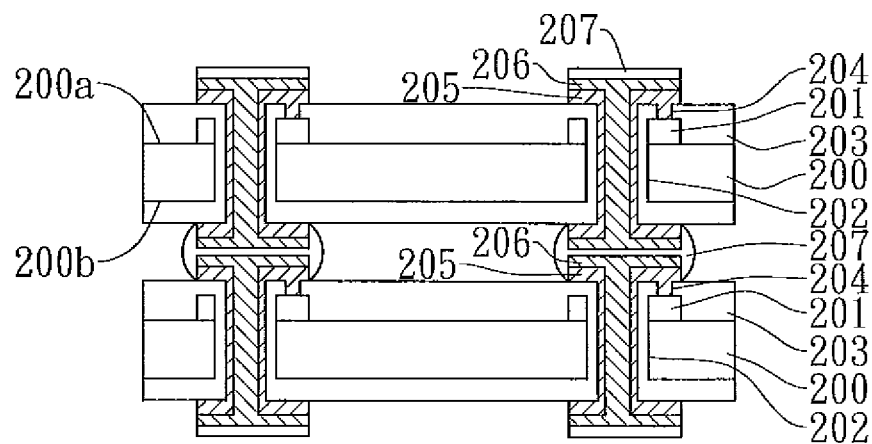
Figure 4:
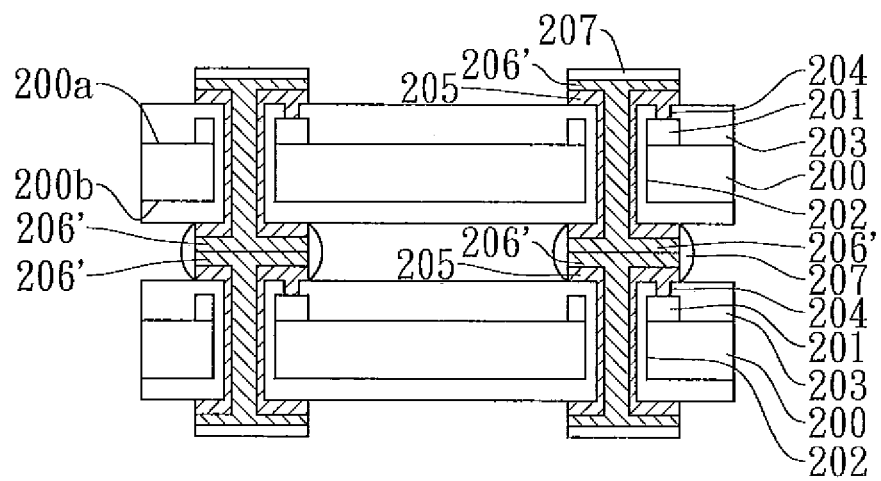
FIG. 4 is a variance of the stacking substrates of the second exemplary embodiment consistent of the present invention.

Please refer to FIG. 2J, a step for stacking dice is proceeded to make at least the two substrates 200 completing the above manufacturing steps stacking and jointing together in a way of backside-to-front side such that the conductive wire pattern layers corresponding thereto jointed to each other. Then, a reflow process is performed to make the third conductive layers 207 jointed to each other molten and completely cover the first conductive layer 205 and the second conductive layer 206. In this situation, the patterned first conductive layer 205 and second conductive layer 206 constitute an electrical connection layer on the insulating layer 203 over the first surface 200a and the second surface 200b of the substrate 200. In the second embodiment, after the reflow step, the third conductive layers 207 can completely cover the electrical connection layers jointed to each other of the upper and lower substrates 200, and the electrical connection layers are jointed together through the third conductive layers 207, as shown in FIG. 2J. Alternatively, the second conductive layers 206' of the electrical connection layers jointed together of the upper and lower substrates 200 can directly contact to each other, as shown in FIG. 4, and the third conductive layers 207 completely cover the electrical connection layers. Another wafer-level manufacturing method for fabricating the present three-dimensional stacking dice is realized by way of the above steps.

Figure 2K:
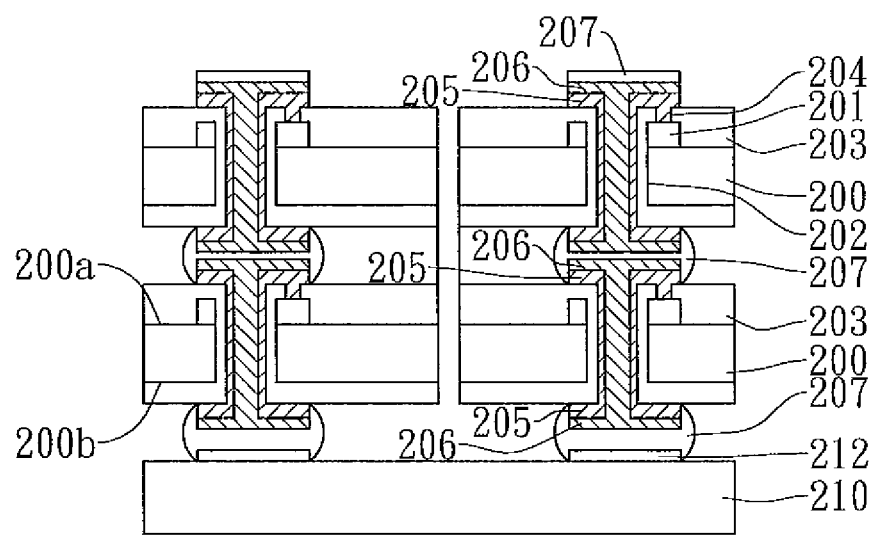

Please refer to FIG. 2K, a step for dicing the stacking dice is proceeded to separate individual stacking dice from the stacking substrates. Continually, the individual stacking dice is attached unto a circuit board 210 such that the conductive wire pattern under the second surface 200b of the bottom substrate 200 of the individual stacking dice is jointed to at least one second conductive pad 212 on the circuit board 210 corresponding thereto. A reflow step is performed to make the third conductive layer 207 molten and completely cover the electrical connection layer under the second surface 200b of the bottom substrate 200 and the second conductive pad 212 jointed to each other. The package structure of the three-dimensional stacking dice of the present invention is completed. This circuit board 210 can be a printed circuit board, or its material can be silicon or ceramic. It should be noted that the electrical connection layers jointed together between the stacking dice and the electrical connection layer and the second conductive pad 212 jointed to each other between the stacking dice and the circuit board 210 are completely covered by the reflowed third conductive layers 207. The breakage of the electrical connection layers and the second conductive pads 212 are avoided. The reliability of the package structure of the three-dimensional stacking dice is increased.

Figure 2L:
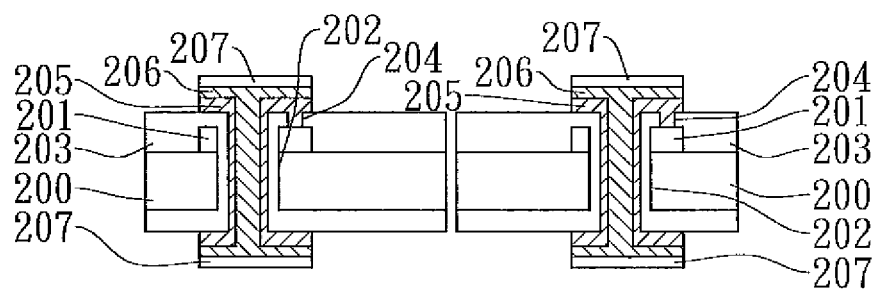
FIG. 2L shows individual die is diced and separated from a wafer completed by the method of the second exemplary embodiment consistent of the present invention.

Please refer to FIG. 2L, in the second embodiment, the die having the vertical electrical conductance made by the above wafer-level manufacturing process can be diced and separated from the substrate 200. Then, at least the two dices are stacked and jointed together in a way of backside-to-front side as the above. Then, the individual stacking dice is assembled unto the circuit board 210 as the above. The same package structure of the three-dimensional stacking dice is obtained.

While the invention has been described by way of examples and in terms of embodiments, it is to be understood that various changes, substitutions, and alterations can be made herein without departing from the spirit and scope of the invention as defined by the appended claims.

What is claimed is:

1. A three-dimensional stacking dice package structure, at least comprising:
    a first substrate having a first surface and a second surface opposite to said first surface, including:
        a die having at least one first conductive pad, at least one through hole; wherein said first conductive pad is formed on a first surface of said first substrate, said through hole is configured to pass through said first conductive pad and said first substrate;
        an insulating layer, formed on said first surface and said second surface of said first substrate and said at least one through hole;
        at least one blind hole, formed on said insulating layer and positioned above said first conductive pad; wherein said through hole and said blind hole are both configured asymmetrically to a position of said first conductive pad;

an electrical connection layer, formed on said insulating layer and filling said through hole and said blind hole so as to perform direct electrical connection between said first surface and said second surface of said first substrate;

wherein said electrical connection layer includes a first conductive layer and a second conductive layer, said first conductive layer is formed between said insulating layer and said second conductive layer;

wherein a portion of said first conductive layer is configured to extend from said through hole and cover a surface of said insulating layer; and a portion of said second conductive layer is configured to extend from said through hole and cover a surface of said first conductive layer;

wherein said portion of said first conductive layer extending from said through hole does not cover the whole surface of said insulating layer; and said portion of said second conductive layer extending from said through hole does not cover the whole surface of said first conductive layer; and a second substrate having a first surface and a second surface opposite to said first surface, including:

a die having at least one first conductive pad, at least one through hole; wherein said first conductive pad is formed on a first surface of said second substrate, said through hole is configured to pass through said first conductive pad and said second substrate;

an insulating layer, formed on said first surface and said second surface of said second substrate and said at least one through hole;

at least one blind hole, formed on said insulating layer and positioned above said first conductive pad; wherein said through hole and said blind hole are both configured asymmetrically to a position of said first conductive pad;

an electrical connection layer, formed on said insulating layer and filling said through hole and said blind hole so as to perform direct electrical connection between said first surface and said second surface of said second substrate;

wherein said electrical connection layer includes a first conductive layer and a second conductive layer, said first conductive layer is formed between said insulating layer and said second conductive layer;

wherein a portion of said first conductive layer is configured to extend from said through hole and cover a surface of said insulating layer; and a portion of said second conductive layer is configured to extend from said through hole and cover a surface of said first conductive layer;

wherein said portion of said first conductive layer extending from said through hole does not cover the whole surface of said insulating layer; and said portion of said second conductive layer extending from said through hole does not cover the whole surface of said first conductive layer; and at least one conductive bump formed to stack said first substrate and said second substrate;

wherein, at said second surface of said first substrate, said conductive bump completely covers the portion of said first conductive layer extending from said through hole and covering a surface of said insulating layer and the portion of said second conductive layer extending from said through hole and covering a surface of said first conductive layer; and wherein, at said first surface of said second substrate, said conductive bump completely covers the portion of said first conductive layer extending from said through hole and covering a surface of said insulating layer and the portion of said second conductive layer extending from said through hole and covering a surface of said first conductive layer.

2. The three-dimensional stacking dice package structure of claim 1, wherein said first substrate includes a plurality of dice, a plurality of first conductive pads, a plurality of through holes and blind holes, said first conductive pads are formed on the first surface of said first substrate, said through holes respectively pass through said first conductive pads and said first substrate, and said blind holes are respectively formed on said first conductive pads.

3. The three-dimensional stacking dice package structure of claim 1, wherein further comprises a circuit board having at least one of second conductive pad, said second substrate is stacked over said circuit board and said electrical connection layer on the second surface of said second substrate joints at least one said second conductive pad.

4. The three-dimensional stacking dice package structure of claim 3, wherein the conductive bump completely covers said electrical connection layer on said second substrate and said second conductive pad.

5. The three-dimensional stacking dice package structure of claim 1, wherein said electrical connection layers jointed together directly contact each other or indirectly contact each other.

6. The three-dimensional stacking dice package structure of claim 1, wherein said first substrate and said second substrate are selected from the group consisting of silicon wafer, III-V group wafer and glass wafer.

* * * * *